United States Patent [19]

Morgan, Jr. et al.

[11] Patent Number: 4,999,529

[45] Date of Patent: Mar. 12, 1991

[54] PROGRAMMABLE LOGIC LEVEL INPUT BUFFER

[75] Inventors: James V. Morgan, Jr., Emmaus; Glen E. Offord, Bethlehem, both of Pa.

[73] Assignee: AT&T Bell Laboratories, Murray Hill, N.J.

[21] Appl. No.: 375,120

[22] Filed: Jun. 30, 1989

[51] Int. Cl.[5] .................. H03K 19/092; H03K 19/096; H03K 19/017; H03K 17/04
[52] U.S. Cl. ..................................... 307/475; 307/443; 307/451; 307/448; 307/481; 307/270
[58] Field of Search ............... 307/475, 264, 270, 584, 307/585, 450, 451, 279, 443, 542, 448, 481; 365/104, 184, 185, 226, 228, 191, 189.11

[56] References Cited

U.S. PATENT DOCUMENTS

| | | | |
|---|---|---|---|
| 4,216,390 | 8/1980 | Stewart | 307/475 X |
| 4,217,502 | 8/1980 | Suzuki et al. | 307/475 X |
| 4,469,959 | 9/1984 | Luke et al. | 307/264 |
| 4,475,050 | 10/1984 | Noufer | 307/475 |
| 4,486,670 | 12/1984 | Chan et al. | 307/475 X |
| 4,565,932 | 1/1986 | Kuo et al. | 307/475 X |
| 4,628,218 | 12/1986 | Nakaizumi | 307/451 |
| 4,672,243 | 6/1987 | Kirsch | 307/475 |
| 4,689,495 | 8/1987 | Liu | 307/264 |
| 4,697,107 | 9/1987 | Haines | 307/475 X |
| 4,703,199 | 10/1987 | Ely | 307/475 X |
| 4,783,607 | 11/1988 | Hsieh | 307/475 |
| 4,820,937 | 4/1989 | Hsieh | 307/475 |
| 4,820,941 | 4/1989 | Dolby et al. | 307/475 X |
| 4,916,334 | 4/1990 | Minagawa et al. | 307/264 X |

Primary Examiner—Stanley D. Miller
Assistant Examiner—David R. Bertelson
Attorney, Agent, or Firm—J. H. Fox

[57] ABSTRACT

An integrated circuit input buffer is adapted to operate at either of two input levels, typically either TTL or CMOS logic levels. This is accommplished by switching an additional transistor (e.g. 15) into a path between the output node (e.g. 12) and a power supply voltage (e.g. $V_{DD}$), thereby changing the ratio of the pull-up to pull-down devices. The desired input level may be selected after the manufacture of the device, as by applying a voltage to a package terminal, or by programming a register during operation of the integrated circuit.

20 Claims, 2 Drawing Sheets

PROGRAMMABLE LOGIC LEVEL INPUT BUFFER

BACKGROUND OF THE INVENTION

1. Field of the Invention

The present invention relates to an integrated circuit having one or more input buffers.

2. Description of the Prior Art

Integrated circuits that operate at CMOS logic levels, presently 0 to 5 volts, usually have a switching point near mid-voltage, about 2.5 volts. These CMOS IC's often must interface with other integrated circuits that operate at TTL logic levels (e.g., 0.8 to 2.0 volts), which have a switching point near 1.4 volts. For this purpose, the input buffers on a CMOS IC chip are designed to receive the TTL input levels and translate them to the CMOS levels used internally on the CMOS chip. However, the need also exists in many cases for one CMOS integrated circuit to interface with another CMOS integrated circuit. In that case, the input buffers are designed to receive the CMOS logic levels. In the prior art, the choice of whether the input buffers are to operate a TTL or CMOS input levels is usually made at the design stage, typically by choosing the ratio of the sizes of the p-channel and n-channel input transistors. For example, for a TTL input buffer, the size of the n-channel input transistor is typically about 10 times the size of the p-channel input transistor, to obtain a relatively low switching threshold. On the other hand, for a CMOS input buffer, the size of the p-channel input transistor is typically about 3 times the size of the n-channel input transistor, to obtain a switching threshold of about one-half the power supply voltage.

In one prior art technique, the DC operating voltage on the source of the p-channel input transistor is set to obtain the desired trigger point of the input inverter, allowing for either a TTL or CMOS input signal level; see U.S. Pat. No. 4,820,937. However, the technique described therein requires a reference voltage generator to obtain the proper voltage level for TTL operation. The reference voltage generator described therein is a relatively complicated analog circuit utilizing an operational amplifier.

SUMMARY OF THE INVENTION

We have invented an integrated circuit having an input buffer that is adapted to operate at either of two (or more) switching levels. The buffer includes at least one input transistor having a gate coupled to an input node, a drain coupled to an output node, and a source coupled to a power supply voltage. The buffer further includes an additional transistor that may be switched into a path between the output node and a power supply voltage, thereby changing the input switching level. In the case of a CMOS input buffer, the additional transistor is typically switched in parallel with the p-channel input transistor. The state of the switching means (on or off) may be selected after the time of manufacture of the integrated circuit, as by applying a voltage to a package terminal, or by programming a register during operation of the integrated circuit, among other techniques.

DETAILED DESCRIPTION

The following detailed description relates to an integrated circuit having an input buffer that is switchable between two input levels, thereby allowing for operating with different types of external circuitry. The illustrative embodiment is described in terms of TTL (0.8 to 2.0 volt) and CMOS (0 to 5 volt) logic levels. However, the present technique may alternatively be used with other logic levels. For example, it may be used with the present (0 to 5 volt) CMOS logic levels, and the upcoming reduced voltage (0 to 3 volt) CMOS logic levels, as described further below.

Figure 1:
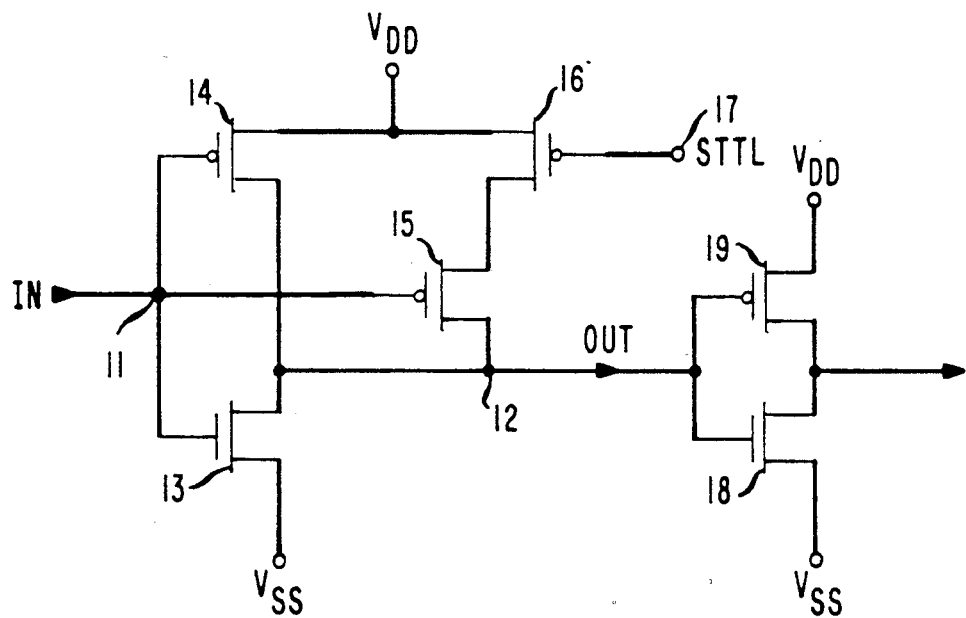
FIG. 1 shows a simple CMOS embodiment of the inventive input buffer.

Referring to FIG. 1, a CMOS input buffer includes a pull-down input transistor 13 and a pull-up input transistor 14. The gates of the input transistors 13 and 14 are connected to a common input node 11, which receives the input signal (IN) from a source external to the integrated circuit. The drains of transistors 13 and 14 are connected to a common output node 12, and the sources of transistors 13 and 14 are connected to negative ($V_{SS}$) and positive ($V_{DD}$) power supply voltage conductors, respectively. The sizes of transistors 13 and 14 influence the gains of these devices, and hence their impedance in the "on" state. The ratio of these impedances is chosen so that the switching threshold of this inverter is at the proper level for one of the desired input logic levels. For example, in a typical CMOS process the channel lengths of these transistors is chosen to be the same. In one present 1.25 micrometer CMOS technology, choosing the width of the p-channel transistor 14 to be one-tenth the width of the n-channel transistor 13 sets the switching threshold of this inverter to be about 1.4 volts, which is suitable for TTL input levels. Other ratios are possible. The output signal (OUT) is typically coupled to an additional inverter stage comprising transistors 18 and 19, in order to build up the signal to full CMOS (0 to 5 volt) signal levels. As thus far described, the circuitry forms a conventional TTL to CMOS input buffer.

However, also included in the inventive input buffer is additional pull-up transistor 15, which also receives the input signal on its gate. In the illustrative example, the width of this transistor is 6 times the width (W) of transistor 13 (i.e., 6 W). Also included is switching transistor 16, also having a width of 6 W. When the level select signal "STTL" at input 17 is low (0 volts), the switching transistor 16 is turned on (conductive), so that additional transistor 15 is effectively included in a current path between $V_{DD}$ and the output node 12. This places the channel of additional pull-up transistor 15 in parallel with the channel of input transistor 14. The effect is approximately the same as having a single p-channel input transistor having a width of 3 W connected between $V_{DD}$ and the output node 12. That is, the effective impedance between $V_{DD}$ and the output node 12 is reduced. Therefore, with transistor 16 turned on, the switching threshold of the input inverter rises to approximately $\frac{1}{2} V_{DD}$, or about 2.5 volts when a 5 volt power supply is used. However, when STTL is high (5 volts), then switching transistor 16 is turned off (nonconductive), and so p-channel transistor 15 is not effective in reducing the impedance between $V_{DD}$ and the output node 12. Hence, the switching threshold remains at the level determined by the ratio of input transistors 14 and 13, being about 1.4 volts for the illustrative TTL case.

Figure 2:
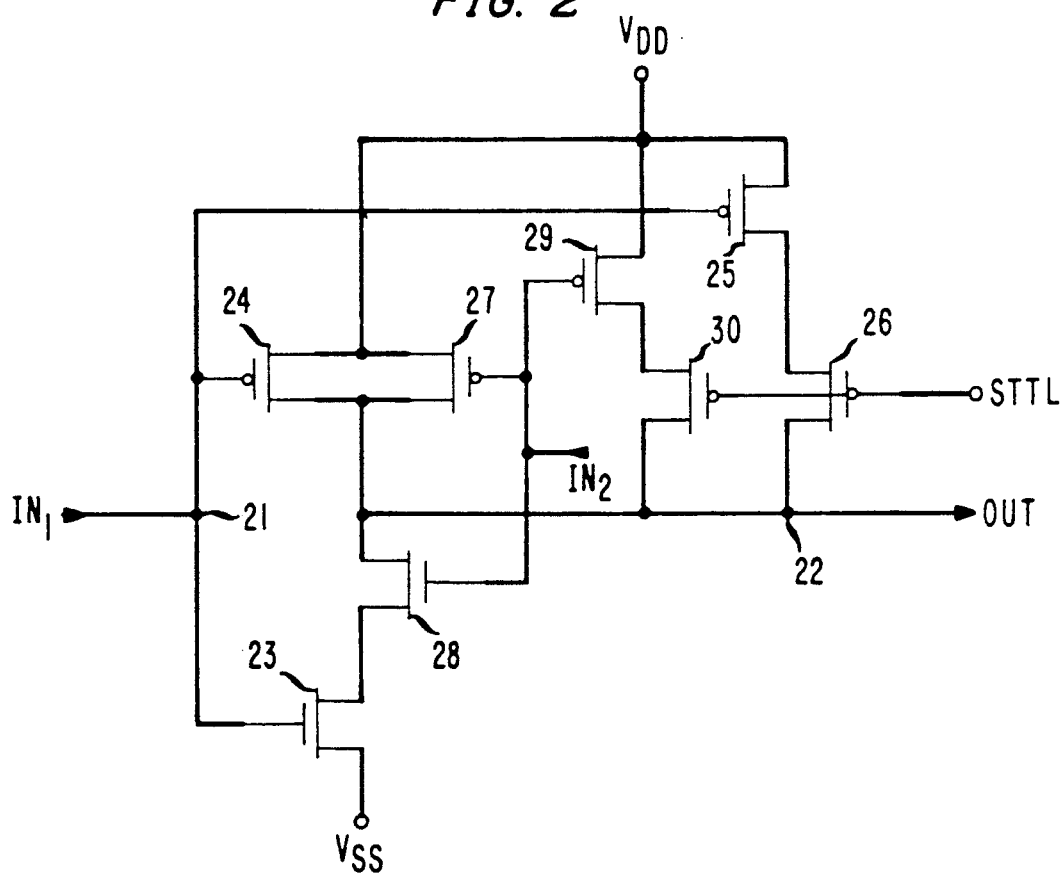
FIG. 2 shows a NAND gate embodiment of the inventive input buffer.

While the above embodiment has shown a simple input inverter using the inventive technique, other logic types are possible. For example, a NAND input gate using the inventive technique is shown in FIG. 2. The TTL/CMOS input signal (IN 1) is applied to input node 21, with n-channel transistor 23 and p-channel transistor 24 serving as the input inverter, as before. Another input signal (IN 2) is applied to the gates of transistors 27 and 28. When IN 2 is logic high (5 volts), transistor 27 is turned off, and transistor 28 is turned on, allowing the inverter transistors 23 and 24 to function. Hence, the signal at output node 22 (OUT) is the logical complement of IN 1. However, when IN 2 is logic low (0 volts), transistor 27 is turned on, and transistor 28 is turned off, forcing the output node 22 to logic high. Hence, the signal OUT is the logical NAND function of IN 1 and IN 2. (The signal OUT is typically coupled to an additional inverter stage to ensure that it is at full CMOS levels, as in FIG. 1.) Still other logic functions may be performed using the present inventive technique.

Note that FIG. 2 also illustrates an alternative arrangement for the switching transistors 26, 30 and the additional pull-up transistors 25, 29. That is, the additional pull-up transistors 25, 29 are connected to the positive power supply voltage $V_{DD}$, with the switching transistors 26, 30 being connected to the output node 22. This arrangement also provides that additional pull-up transistors 25, 29 may be switched into a path between the output node and a power supply voltage ($V_{DD}$), thereby setting the switching point voltage level. Although the arrangement shown in FIG. 2 provides for switching the input level of both inputs with the same signal STTL, it is alternatively possible to provide separate signals for independently selecting the input switching levels of inputs IN 1 and IN 2.

While the above embodiments have placed the additional transistor in parallel with the pull-up (e.g., p-channel) input transistor, it is alternatively possible to place the additional transistor in parallel with the pull-down input transistor, in which case the additional transistor has the same conductivity type as the pull-down transistor (e.g., n-type). However, in present day CMOS technology, that requires larger transistor sizes to obtain the required ratios for CMOS to TTL conversion. Furthermore, while the above illustrative embodiment has been for a complementary technology (CMOS), it is possible to use the present invention with IC technologies that provide only single-conductivity devices (e.g., NMOS or PMOS). For example, referring to FIG. 3, in NMOS technology the pull-up device may be an enhancement mode n-channel load transistor 34 having its gate and drain connected to $V_{DD}$, and its source connected to the output node 32. The additional transistor 35 is an n-channel transistor that is capable of being switched in parallel with the n-channel input transistor 33. This is accomplished by means of switching transistor 36, which is turned on when STTL is high. Still other pull-up device types (e.g., depletion mode devices) are possible.

Figure 3:
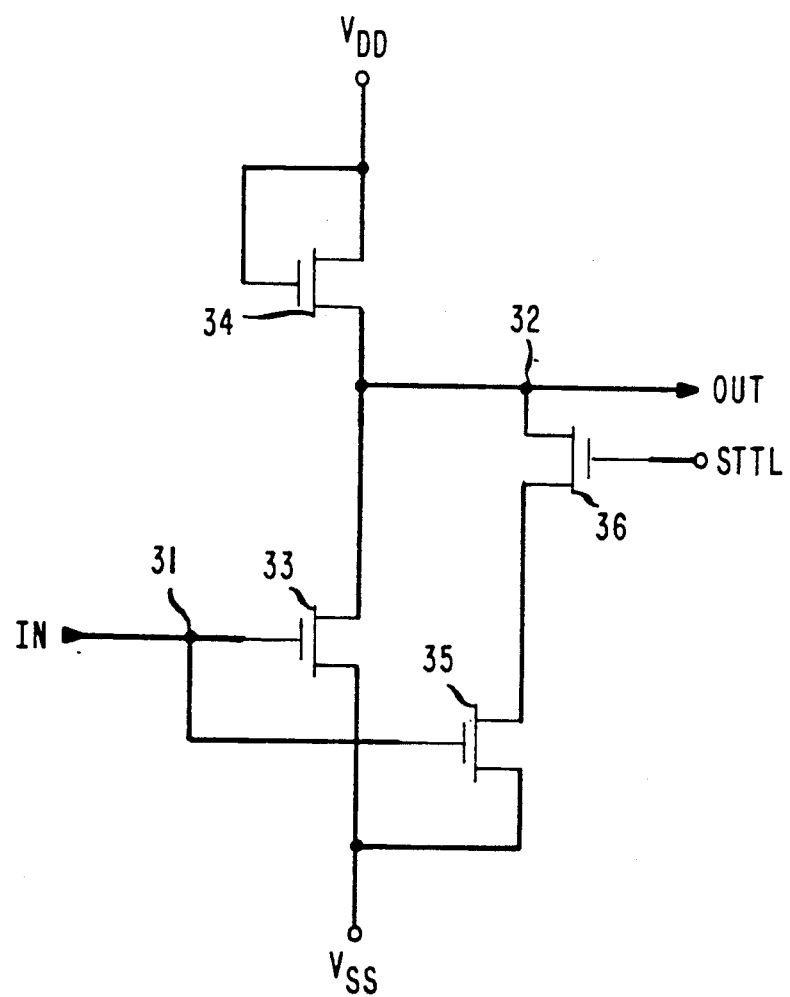
FIG. 3 shows a NMOS embodiment of the inventive input buffer.

The present invention is not limited to the case of TTL and CMOS signal levels. The transistor ratios indicated above are also suitable for use with a 0–3 volt CMOS signal level when transistor 16 of FIG. 1 is off (STTL high), in lieu of the TTL logic levels. This allows ready interfacing of CMOS integrated circuits using either the 0–3 volt or 0–5 volt signal levels. Still other signal levels may be chosen by the appropriate choice of the transistor ratios. Furthermore, it is possible to provide more than two switching levels, by including additional transistors that may be switched in parallel with an input transistor according to the present technique. Although the gate of the additional transistor is typically connected to the input node, as shown in FIGS. 1–3, that is not necessary in all cases. For example, in the NMOS case shown in FIG. 3, the additional transistor may be switched in parallel with the load transistor 34. In that case, the gate of the additional transistor may be connected to the switching signal STTL. This then eliminates the need for a separate switching transistor, since the additional transistor itself becomes non-conductive when it is desired to remove it from the circuit.

Still other variations on the circuitry are possible. For example, it is desirable in some cases to provide protection to the n-channel pull-down transistor (13, 23) against degradation due to "hot carrier" effects. This may be accomplished by connecting a "protective" n-channel transistor (not shown) between the drain of the pull-down transistor and the output node. The voltage drop across the protective transistor then provides for a reduction of the voltage across the n-channel pull down transistor, and hence a reduction of the voltage-induced degradation effects. This technique is further described in co-assigned U.S. Pat. No. 4,704,547.

The level select signal STTL that controls the operation of the inverter may be generated by a variety of techniques. In one embodiment, a package terminal of the integrated circuit is devoted to this function, and the signal is supplied by an external source. In another embodiment, a register is included in the integrated circuit, and a coded signal is supplied to a register input pin for generating the desired STTL signal during the operation of the integrated circuit. It can be seen that more than one input buffer can be individually controlled by the use of multiple coded signals in this manner. Hence, some of the inputs may be selected to be at the TTL input level, and others at the CMOS input level, allowing a general purpose integrated circuit to interface with a variety of other chip combinations. It is alternatively possible to generate the signal STTL by examining the level of the input signal. For example, a comparator circuit of a type known in the art may be used to determine if the input voltage exceeds a given level (e.g., 3.5 volts). If so, the comparator circuitry generates a low STTL signal to select the CMOS input level. Otherwise, the comparator circuitry generates a high STTL signal to select the TTL input level. Still other techniques for generating the level select signal STTL are possible.

Although the foregoing embodiments have been given in terms of silicon technology, it is apparent that other (e.g., group III–V) semiconductor technologies can advantageously utilize the present technique. Furthermore, while the input supplied to the inventive buffer is typically a binary logic signal, other inputs are possible, including analog signals. That is, the attributes of good noise margin (due to the higher switching threshold) and no DC current drain when in the "CMOS" mode are useful in a variety of applications. For example, in one present design, a clock input receives a TTL clock signal when the buffer is in the TTL mode. However, by placing the buffer in the "CMOS"

mode, and connecting a quartz crystal to the input, the circuit can be made to oscillate, thereby generating the clock signal on-chip. Still other applications are possible.

We claim:

1. An integrated circuit including at least one input buffer having an input node and an output node, with said buffer comprising:

a first input transistor of a given conductivity type having a gate coupled to said input node, and being coupled to pull the output node toward a first power supply voltage; and a second transistor coupled to pull the output node toward a second power supply voltage;

with the input switching level of said buffer being influenced by the ratio of the impedances of the first and second transistors, characterized in that said input buffer further comprises:

a third transistor of said given conductivity type having its drain connected to the drain of said second transistor, and its gate coupled to said input node and means for providing a level select signal for switching the channel of said third transistor into a path between said output node and a power supply voltage, whereby the input switching level of said buffer is selected.

2. The integrated circuit of claim 1 wherein said second transistor has the opposite conductivity type as said given type, and said second transistor has its gate coupled to said input node.

3. The integrated circuit of claim 1 wherein said second transistor has said given conductivity type, and said second transistor has its gate coupled to said second power supply voltage.

4. The integrated circuit of claim 1 wherein said means for switching comprises a fourth transistor having its source coupled to said first power supply voltage, and its drain coupled to the source of said third transistor.

5. The integrated circuit of claim 1 wherein said level select signal is generated externally to said integrated circuit.

6. The integrated circuit of claim 1 wherein said level select signal is generated on said integrated circuit.

7. The integrated circuit of claim 6 wherein said level select signal is generated by a comparator located on said integrated circuit.

8. The integrated circuit of claim 6 wherein said level select signal is generated by a register located on said integrated circuit.

9. An integrated circuit including at least one input buffer having an input node and an output node, with said buffer comprising:

a first input transistor of a given conductivity type having a gate coupled to said input node, and being coupled to pull the output node toward a first power supply voltage; and a second transistor coupled to pull the output node toward a second power supply voltage;

with the input switching level of said buffer being influenced by the ratio of the impedances of the first and second transistors, characterized in that said input buffer further comprises:

a third transistor of said given conductivity type having its gate coupled to said input node, and its source coupled to said first power supply voltage; and a fourth transistor having its source coupled to the drain of said third transistor, and its drain connected to said output node;

and means for providing a level select signal to the gate of said fourth transistor, for switching the channel of said third transistor into a path between said output node and said first power supply voltage, whereby the input switching level of said buffer is selected.

10. The integrated circuit of claim 9 wherein said second transistor has the opposite conductivity type as said given type, and said second transistor has its gate coupled to said input node.

11. The integrated circuit of claim 9 wherein said second transistor has said given conductivity type, and said second transistor has its gate coupled to said second power supply voltage.

12. The integrated circuit of claim 9 wherein said level select signal is generated externally to said integrated circuit.

13. The integrated circuit of claim 9 wherein said level select signal is generated on said integrated circuit.

14. The integrated circuit of claim 13, wherein said level select signal is generated by a comparator located on said integrated circuit.

15. The integrated circuit of claim 13 wherein said level select signal is generated by a register located on said integrated circuit.

16. An integrated circuit including at least one input buffer having an input node and an output node, with said buffer comprising:

a first input transistor of a given conductivity type having a gate coupled to said input node, and being coupled to pull the output node toward a first power supply voltage; and a second transistor coupled to pull the output node toward a second power supply voltage;

with the input switching level of said buffer being influenced by the ratio of the impedances of the first and second transistors, characterized in that said input buffer further comprises:

a third transistor of said given conductivity type having its source coupled to a given power supply voltage, its drain connected to said common output node; and its gate coupled to means for providing a level select signal, whereby the input switching level of said buffer is selected.

17. The integrated circuit of claim 16 wherein said second transistor has the opposite conductivity type as said given type, and said second transistor has its gate coupled to said input node.

18. The integrated circuit of claim 16 wherein said second transistor has said given conductivity type, and said second transistor has its gate coupled to said second power supply voltage.

19. The integrated circuit of claim 16 wherein said level select signal is generated externally to said integrated circuit.

20. The integrated circuit of claim 16 wherein said level select signal is generated on said integrated circuit.

* * * * *